United States Patent [19]
Shimizu et al.

[11] Patent Number: 5,285,068
[45] Date of Patent: Feb. 8, 1994

[54] PHOTO-DETECTOR AND PHOTO-DETECTION METHOD USING THE SAME

[75] Inventors: Akira Shimizu, Inagi; Kazuhito Fujii, Atsugi, both of Japan

[73] Assignee: Canon Kabushiki Kaisha, Tokyo, Japan

[21] Appl. No.: 660,027

[22] Filed: Feb. 25, 1991

[30] Foreign Application Priority Data

Feb. 26, 1990 [JP] Japan .................. 2-45085

[51] Int. Cl.⁵ .................. H01L 31/10; H01L 27/14; G01J 5/20
[52] U.S. Cl. .................. 250/338.4; 250/370.01; 250/370.14; 257/20; 257/21; 257/187; 257/194; 257/290
[58] Field of Search .................. 357/30, 16, 22; 250/338.4, 370.01, 370.14; 350/353, 355; 455/610; 257/20, 21, 194, 187, 290

[56] References Cited

U.S. PATENT DOCUMENTS

| | | | |
|---|---|---|---|
| 3,887,876 | 6/1975 | Zeidler | 455/610 |
| 4,745,452 | 5/1988 | Sollner | 357/30 |
| 4,816,878 | 3/1989 | Kano et al. | 357/16 |
| 4,970,566 | 11/1990 | Mendelhall | 357/16 |
| 5,003,360 | 3/1991 | Okada et al. | 357/22 |

OTHER PUBLICATIONS 50-th Scientific Lecture of Japan Society of Applied Physics Lecture Letters, 27p-Z-1, 1989 Autumn.

Applied Physics Letters, vol. 48, No. 7, pp. 487-489, Feb. 17, 1986 Datta et al.

*Primary Examiner*—Jerome Jackson
*Attorney, Agent, or Firm*—Fitzpatrick, Cella, Harper & Scinto

[57] ABSTRACT

A photo-detector for detecting a light having a predetermined photon energy, comprises: a semiconductor member having a source region, a gate region and a drain region; a first path for propagating an electron wave from the source region to the drain region through the gate region; a second path for propagating an electron wave from the source region to the drain region through the gate region; the second path being of quantum well structure or a quantum line structure and having a plurality of electron levels having an energy difference therebetween slightly smaller or slightly larger than the photon energy of the light to be detected; a wave function of the electron wave propagating through the second path being coupled with a wave function of the electron wave propagating through the first path in the source region and the drain region and separated from the wave function of the electron wave propagating through the first path in the gate region; means for applying a voltage across the source region and the drain region; means for detecting a current flowing across the source region and the drain region. When the light to be detected is applied to the second path, the electron levels are shifted by an optical Stark effect and phase difference is created between the electron wave propagating through the first path and the electron wave propagating through the second path so that the current changes.

35 Claims, 3 Drawing Sheets

PHOTO-DETECTOR AND PHOTO-DETECTION METHOD USING THE SAME

BACKGROUND OF THE INVENTION

1. Field of the Invention

The present invention relates to a photo-detector which converts a light intensity to a current magnitude for detection and a photo-detection method using the same, and more particularly to a photo-detector which does not substantially absorb a light to be detected.

2. Related Background Art

A PIN photo-diode and an avalanche photo-diode have been known as a photo-detector which converts a light intensity to an electrical signal for detection.

In such photo-diodes, however, a light to be detected is absorbed and carriers are generated by an energy of the absorbed light. As a result, a substantial portion of the light does not pass through the photo-detector. For example, where the photo-diode is applied to a bus type light communication system which receives a signal light serially by a plurality of receivers, a photo-diode in the first receiver in a communication path absorbs the signal light and the light does not reach the second and subsequent receivers. Thus, each receiver has to newly generate the same signal light as that it received and transmit the generated signal light to the succeeding receiver.

SUMMARY OF THE INVENTION

It is an object of the present invention to provide a photo-detector which can detect an intensity of a light to be detected without substantially attenuating the light, and a photo-detection method using the same.

The above object of the present invention is attained by a photo-detector for detecting a light having a predetermined photon energy, comprising:

a semiconductor member having a source region, a gate region and a drain region;

a first path for propagating an electron wave from the source region to the drain region through the gate region;

a second path for propagating an electron wave from the source region to the drain region through the gate region;

the second path being of quantum well structure or a quantum line structure and having a plurality of electron levels having an energy difference therebetween slightly smaller or slightly larger than the photon energy of the light to be detected;

a wave function of the electron wave propagating through the second path being coupled with a wave function of the electron wave propagating through the first path in the source region and the drain region and separated from the wave function of the electron wave propagating through the first path in the gate region;

means for applying a voltage across the source region and the drain region;

means for detecting a current flowing across the source region and the drain region;

whereby when the light to be detected is applied to the first path, the electron levels are shifted by an optical Stark effect and a phase difference is created between the electron wave propagating through the first path and the electron wave propagating through the second path so that the current changes.

The object of the present invention is also attained by a method for detecting a light by using the above photo-detector, comprising the steps of:

applying a voltage across the source region and the drain region to cause a current to flow thereacross;

applying the light to be detected to the second path to shift the electron levels by an optical Stark effect; and detecting the current varied by a phase difference caused by the shift of the electron levels between the electron wave propagating through the first path and the electron wave propagating through the second path.

DETAILED DESCRIPTION OF THE PREFERRED EMBODIMENTS

Figure 1:
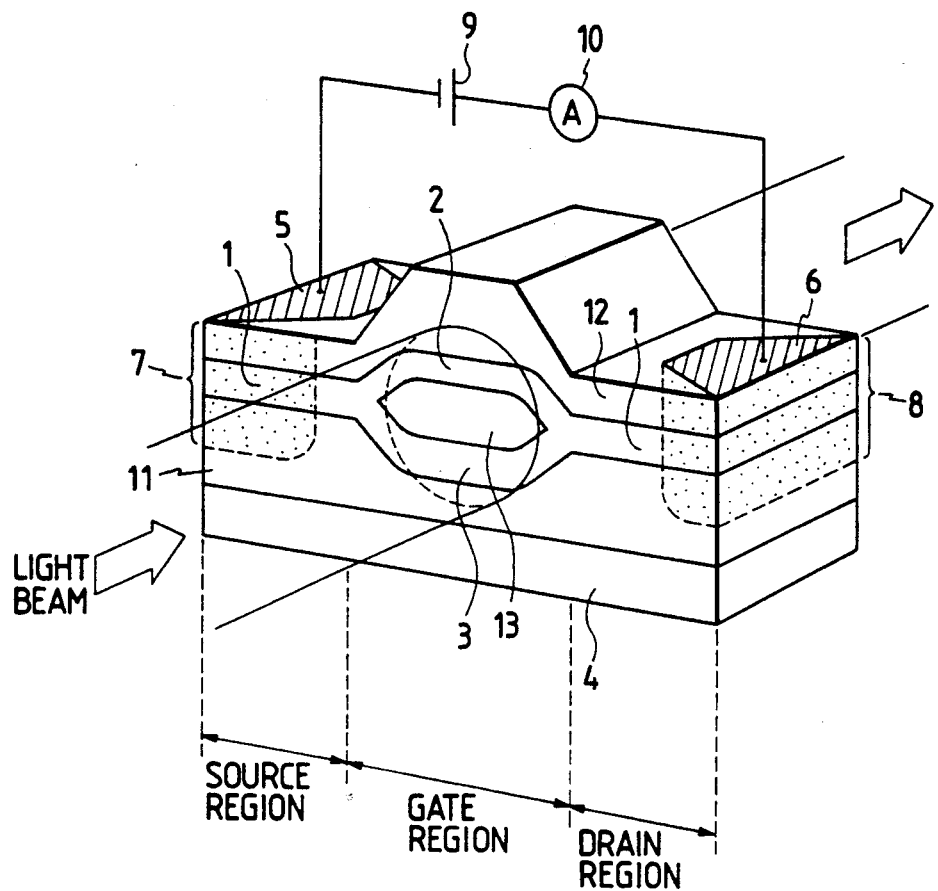
FIG. 1 shows a schematic perspective view of an embodiment of a photo-detector of the present invention.

FIG. 1 shows a schematic perspective view of an embodiment of a photo-detector of the present invention.

In FIG. 1, numeral 4 denotes a substrate made of a semiconductor such as GaAs. Sequentially laminated on the substrate 4 are a first clad layer 11, a first wave guide layer 3, a second clad layer 13, a second wave guide layer 2 and a third clad layer 12. Each of the clad layers is made of a semiconductor such as AlAs, and each of the wave guide layers is made of a semiconductor such as AlGaAs. Those layers may be formed by a molecular beam epitaxy (MBE) method.

The semiconductor layers laminated on the substrate include a source region, a gate region and a drain region. A source electrode 5 and a drain electrode 6 are formed in the source region and the drain region, respectively. Impurities are diffused into the portions of the semiconductor layers in which the electrodes are formed to form electrode diffusion areas 7 and 8, which are of n-type (n+). A stripe-shaped raised portion which extends along an incident direction of a light beam to be detected is formed on the third clad layer 12 in the gate region. The semiconductor layer under the raised portion has a higher effective refractive index than that of other portion so that a channel-shaped optical wave guide is formed.

Connected to the electrodes 5 and 6 are a voltage source 9 for applying a voltage across the source region and the drain region. The first wave guide layer 3 and the second wave guide layer 2 forms a path to propagate an electron wave, and a current flows across the source region and the drain region through the gate region upon application of the voltage. The current is detected by an ammeter 10 connected to the electrodes 5 and 6. In the source region and the drain region, the first wave guide layer 3 and the second wave guide layer 2 are integrally formed as shown in the path 1. Those wave guide layers are not necessarily integrally formed but they may be arranged very closely to each other so that wave functions of the electron wave which propagates therethrough assume a coupled form in the source region and the drain region. On the other hand, in the gate region, the first wave guide layer 3 and the second wave guide layer 2 are sufficiently spaced from each other so that the wave functions of the electron wave propagating therethrough assume an independent form.

The thickness of the wave guide layers 2 and 3 is sufficiently thin such as several Å to several tens Å so that they assume a quantum well structure (QWS). As a result, sub-bands are produced in those wave guide layers by a quantum size effect. The thickness of the first wave guide layer 3 is selected such that an energy difference between electron levels in the wave guide layer 3 is slightly smaller than a photon energy of the light to be detected. On the other hand, the thickness of the second wave guide layer 2 is selected such that an energy difference between electron levels in the wave guide layer 2 is slightly smaller than the photon energy of the light to be detected. Namely, the following relations are met.

$$E_{Wb} - E_{Wa} < \hbar\omega < E_{Nb} - E_{Na} \quad (1)$$

$$\hbar\omega = E_{Wb} - E_{Wa} - \delta_W \quad (2)$$

$$\hbar\omega = E_{Nb} - E_{Na} - \delta_N \quad (3)$$

$$|\delta_W| < < \hbar\omega \quad (4)$$

$$|\delta_N| < < \hbar\omega \quad (5)$$

Where $E_{Na}$, $E_{Nb}$, ... are specific energies of sub-bands of the second wave guide layer 2 in an ascending order, $E_{Wa}$, $E_{Wb}$ ... are specific energies of sub-bands of the first wave guide layer 3 in the ascending order, $\hbar\omega$ is a photon energy of the light to be detected, and $\delta_W < 0$, $\delta_N > 0$.

Because $\delta_W$ and $\delta_N$ are very small, an optical Stark effect is produced when the light to be detected is directed to each well layer. A first feature of the present invention resides in the detection of the light by making use of the optical Stark effect.

The optical Stark effect is explained below. Level intervals in an atom do not coincide with each other if electrons have isolated energy levels, but when a light having a photon energy which is close to the energy levels of the electrons is applied to the atom, the energy levels, of the electrons shift. This is called the optical Stark effect. In the present invention, the isolated levels correspond to the energy levels of the sub-bands of the quantum well structure. Accordingly, in the present invention, the optical Stark effect by the inter-sub-band virtual transition is produced.

For example, it is assumed that the specific energies $E_a$, $E_b$, ..., in the ascending order, of the sub-bands in the QWS semiconductor layer meet the following relations.

$$\hbar\omega = E_b - E_a - \delta \quad (6)$$

$$|\delta| < < \hbar\omega \quad (7)$$

When a light having an intensity $\omega$ of an electric field vector is applied to the semiconductor layer, the levels of the sub-bands shift as follows.

$$E_a \rightarrow E_a - (e\mu\epsilon)^2/\delta \quad (8)$$

$$E_b \rightarrow E_b + (e\mu\epsilon)^2/\delta \quad (9)$$

Where e is a unit charge and $\mu$ is a length of a bipolar moment of the transition from the state of energy level $E_a$ to the state of energy level $E_b$. The length $\mu$ of the bipolar moment is generally several Å at most for the atom. However, in the QWS of the present embodiment, the length of the bipolar moment is as long as 10 Å or longer. That is, the optical Stark effect by the virtual transition among the sub-bands of the QWS is larger than usual one, and this, when combined with making the electric field vectors of the light to be normal to the planes of the semiconductor layers and making $|\delta|$ to be sufficiently small, contribute to improve a sensitivity of the photo-detector of the present invention.

A second feature of the photo-detector of the present invention resides in substantially no absorption of the light to be detected. To this end, the following relations must be met.

$$|\delta_W| \geq \Gamma_{Wa} + \Gamma_{Wb} \quad (10)$$

$$|\delta_N| \geq \Gamma_{Na} + \Gamma_{Nb} \quad (11)$$

$$\hbar\omega < < \hbar\omega_{LO} \quad (12)$$

Where $\hbar\omega_{LO}$ is a longitudinal optical (LO) phonon energy. Of various phonons such as lateral wave and longitudinal wave phonons of an acoustic mode, the LO phonon has the largest oscillation energy. Accordingly, if the phonon energy of the light to be detected is larger than the LO phonon energy, the absorption of the light to be detected, by the phonon is negligibly small. This condition is met in the QWS which has relatively thin well layer thickness, for example, approximately several tens Å.

Figure 2:
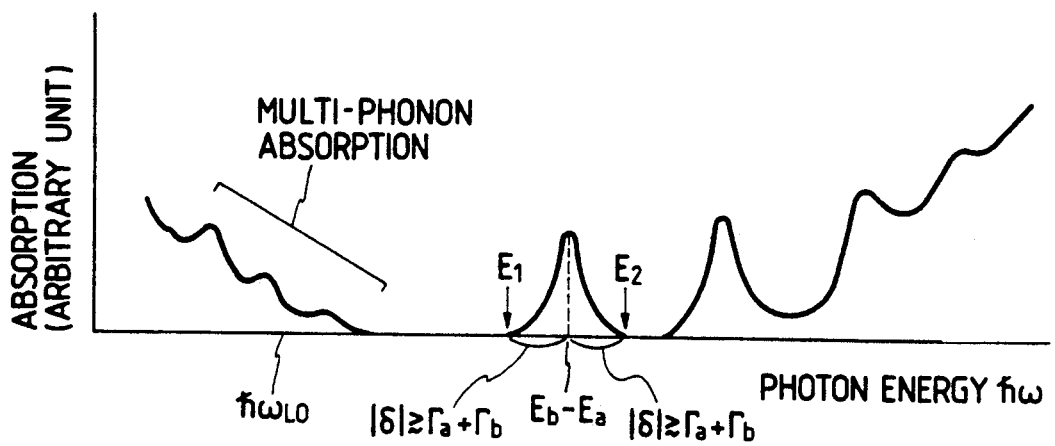
FIG. 2 shows a light absorption spectrum in the embodiment.

The above condition is represented by an absorption spectrum shown in FIG. 2, in which an abscissa represents a photon energy and an ordinate represents the absorption, $E_a$ denotes a specific energy in the second level of the well layer of the QWS having conduction carriers, $\Gamma_a$ denotes an energy width in the first level of the well layer, and $\Gamma_b$ denotes an energy width of the second level. The photon energy of the light to be detected is set to $E_1$ or $E_2$. A difference $\delta$ between $E_1$ or $E_2$ and $E_b - E_a$ meets a relation of $|\delta| \geq \Gamma_a + \Gamma_b$.

In the photo-detector thus arranged, when the light to be detected is applied to the wave guide layers 2 and 3 of the gate region, the electron levels of the sub-bands of the wave guide layers shift because of the Stark effect. As they shift, the number of waves which are injected from the source region 5 and propagate through the wave guide layers toward the drain region changes. If the shift amounts of the electron levels are set differently for the wave guide 2 and the wave guide 3, the changes in the number of waves are different for the electron wave which passes through the path formed by the wave guide layer 2 and the electron wave which passes through the path formed by the wave guide layer 3. By setting the numbers of waves differently, a phase difference is produced between the electron waves which pass through the respective paths.

The larger the phase difference is, the smaller is an amplitude of the electron wave merged in the drain region so that a current which flows across the source region and the drain region decreases.

The shift amount of the electron levels is proportional to an intensity of the light applied to the gate region, and the phase difference between the electron waves which pass through the respective paths also changes in accordance therewith. Accordingly, the intensity of the light to be detected may be calculated from the current flowing across the source electrode 5 and the drain electrode 6, which is detected by an ammeter 10. Since the light to be detected is not substantially absorbed as described above, the light beam to be detected is transmitted without substantial attenuation as shown in FIG. 1.

In order to make the shift amounts of the electron levels by the Stark effect different in the respective wave guide layers, deviation energies $\delta$ may be differed because the shift amount is proportional to the deviation energy $\delta$ as described above. To this end, the sub-band intervals $E_b - E_a$ or the lengths $\mu$ of the bipolar moments in the respective wave guide layer may be differed. A simplest way to attain such wave guide layers is to form the respective wave guide layers to have different thicknesses.

An operation of the photo-detector of the present invention is explained in detail.

Figure 3:
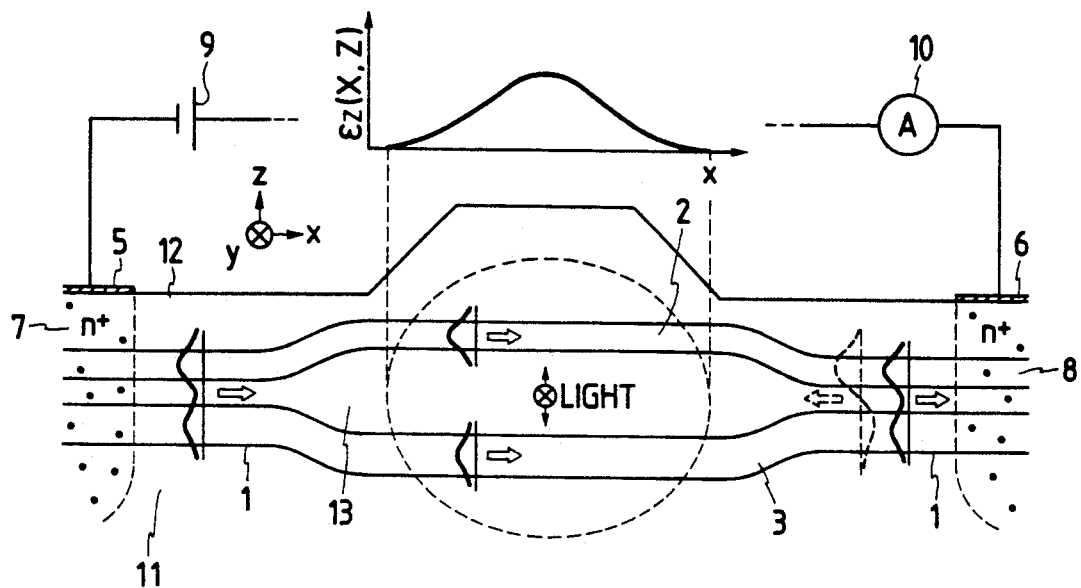
FIG. 3 illustrates a manner of propagation of an electron wave in the embodiment.

FIG. 3 shows a manner of propagation of the electron wave in the embodiment. In FIG. 3, the like elements to those shown in FIG. 1 are designated by the like numerals and detailed explanation thereof is omitted. In the source region and the drain region, the wave guide layers 2 and 3 are arranged very closely to each other so that they can be regarded as a single path 1. As described above, the optical wave guide is provided in the gate region, and the light to be detected as shown by a broken line circle is applied to the optical wave guide. The graph in FIG. 3 diagrammatically shows a mode function $\epsilon_z$ (electric field vector along a z axis) of the light to be detected. The light to be detected propagates in y direction, that is, normally to the plane of drawing in FIG. 3. A direction of polarization of the light to be detected is selected such that the electric field vector is oriented in z direction.

Figure 4A:
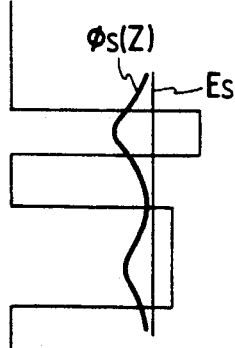
FIGS. 4A, 4B and 4C show potentials of paths and wave functions of electron waves propagated along the paths, in the embodiment.
Figure 4B:
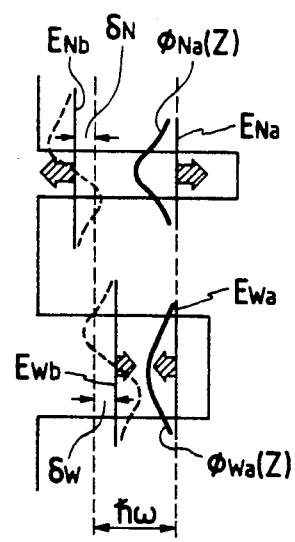
Figure 4C:
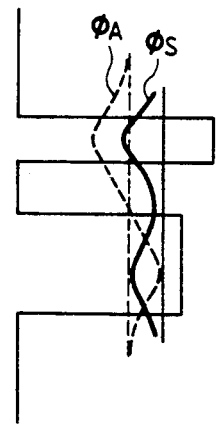

FIGS. 4A, 4B and 4C show potentials of the respective wave guide layers in the source region, the gate region and the drain region, and the wave function of the electron wave. As seen from those drawings, in order to make the amounts of Stark shift different, the respective wave guide layers are formed to have different thicknesses, as described above. Energies of base levels of the sub-bands of the respective layers are selected to be equal so that the electron wave representing the wave function merged in the source region is evenly distributed to the respective wave guide layers in the gate region. Where the wave guide layers are made of $Al_xGa_{1-x}As$, the base level energies are adjusted by changing a composition x of Al.

In FIG. 3, the electrons injected from the source electrode 5 propagate through the wave guide layers toward the drain electrode 6 with the following wave function.

$$e^{ikx}\phi_s(z) Y(y) \tag{13}$$

The electrons have the following energy E.

$$E = (\hbar^2/2m^*)k^2 + E_s + E_Y \tag{14}$$

Where m* is an effective mass of electrons moving along the x axis, k is the number of angular waves of the motion along the x axis, $E_s$ and $\phi_s(z)$ are the base level energy of the sub-band of the electron and the wave function in the z direction, respectively, and $E_Y$ and $Y(y)$ are the base level energy and the wave function of the sub-band of the electron in the y direction, respectively.

As shown in FIG. 4B, the wave function of the electrons is divided into two along the z axis in the gate region. The electrons which propagate through the wave guide layer 2 have the following wave function and the energy E.

$$e^{ik_Nx}\phi_{Na}(z) Y(y) \tag{15}$$

$$E = (\hbar^2/2m^*)k_{N2} + E_{Na} + E_Y \tag{16}$$

On the other hand, the electrons which propagate through the wave guide layer 3 have the following wave function and the energy E.

$$e^{ik_Wx}\phi_{Wa}(z) Y(y) \tag{17}$$

$$E = (\hbar^2/2m^*)k_{W2} + E_{Wa} + E_Y \tag{18}$$

Where $E_{Na}$ and $\phi_{Na}(z)$ are the base level energy and the wave function of the sub-band of the electron in the z direction of the wave guide layer 2, respectively, $E_{Wa}$ and $\phi_{Wa}(z)$ are the base level energy and the wave function of the sub-band of the electron in the z direction of the wave guide layer 3, respectively, and $k_N$ and $k_W$ are the numbers of angular waves in the motion along the x axis in the wave guide layers 2 and 3, respectively. In the formulas (15) and (17), a normalization constant is omitted.

In general, since $E_{Na} \neq E_s$, $k_N \neq k$ from the formulas (14) and (16). Similarly, for the wave guide layer 3, $k_W \neq k$. However, in the present embodiment, $k_N = k_W$ because $E_{Na} = E_{Wa}$ when the light to be detected is not applied, as described above.

When the light to be detected is applied to the gate region of the photo-detector, the following Stark shift takes place as described above.

$$E_{Na} \to E_{Na} - (e\mu_N\epsilon)^2/\delta_N \tag{19}$$

$$E_{Wa} \to E_{Wa} - (e\mu_W\epsilon)^2/\delta_W \tag{20}$$

Where $\mu_N$ and $\mu_W$ are the lengths of bipolars of the transition from the first level to the second level in the wave guide layers 2 and 3, respectively. In the present embodiments, the lengths are selected as shown in the formulas (1) to (3), and $\delta_W < 0$ and $\delta_N > 0$. From the formulas (19) and (20), it is seen that the $E_{Na}$ of the wave guide layer 2 shifts downward and the $E_{Wa}$ of the waveguide layer 3 shift upward. This is shown by arrows in FIG. 4B. By the Stark shift, the number $k_N$ of angular waves of the wave guide layer 2 increases and the number $k_W$ of angular waves of the wave guide layer 3 decreases, as seen from the formulas (14) and (16).

Where the numbers of waves in the respective wave guide layers are different, a phase difference is created between the electrons propagated therethrough by the same distance along the x axis. Assuming that the light to be detected is applied in the range of $0 \leq x \leq L$, the phase difference $\Theta$ is given by $$\theta = \int_0^L (k_N - k_W) dx \qquad (21)$$

Figure 5:
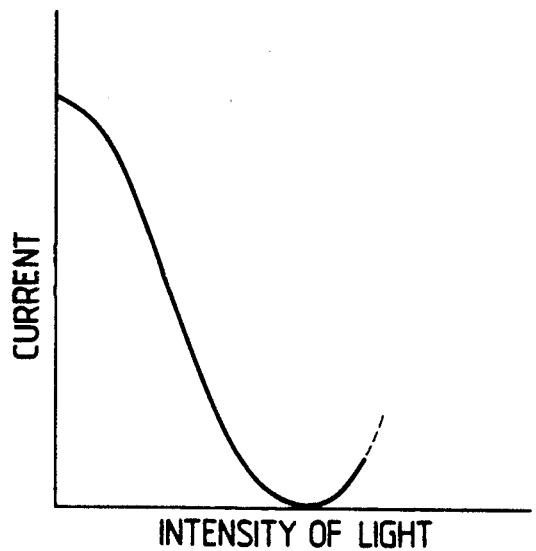
FIG. 5 shows a relation between an intensity of light to be detected and a detected current, in the embodiment.

For example, where the phase difference $\Theta$ is equal to $\pi$, the wave function when the electron waves propagated through the respective wave guide layers are merged is not in the base level state $\phi_s$ but in the second state $\phi_A$, as shown in FIG. 4C. However, since it has only the energy corresponding to $\phi_s$, the propagated electron wave is reflected. That is, when the phase difference of the electron wave is equal to $\pi$, the electrons cannot reach the drain electrode 6 and no current flows across the source electrode and the drain electrode. More particularly, since the phase difference $\Theta$ increases as the intensity of the light related to $\epsilon^2$ increases as seen from the formulas (19) to (21), the intensity of the light to be detected can be determined by detecting the current flowing through the electrodes by the ammeter 10. A relation between the intensity of the light to be detected and the detected current is shown in FIG. 5.

In the present embodiment, the wave guide layers are formed to meet the relation of the formula (1) so that the directions of shift of the electron levels are opposite for the respective wave guide layers. As a result, the phase difference between the electron waves propagating through the respective wave guide layers increases and the light can be detected with a high sensitivity. However, where the magnitudes of the Stark shift are different in the respective wave guide layers when the light to be detected is applied, the directions of shift of the electron levels need not necessarily be opposite.

In order to attain a sufficient phase difference in the photo-detector of the present invention, it is preferable that the length L is shorter than a scatter length of non-elastic scatter of the electrons.

Figure 6:
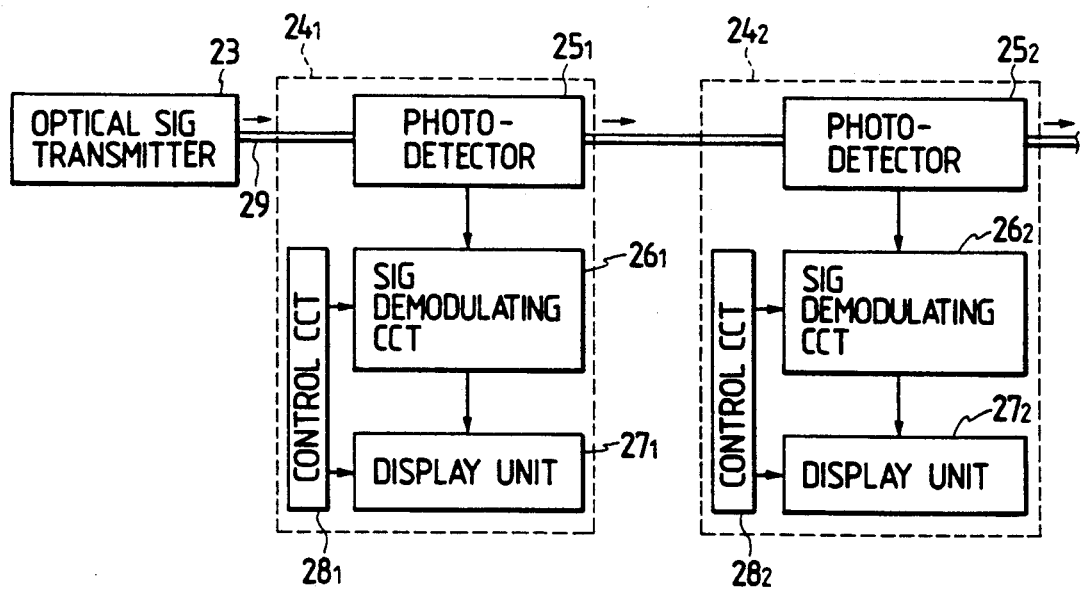
FIG. 6 shows a block diagram of a configuration of a light communication system which uses the photo-detector of the present invention.

FIG. 6 shows a block diagram of a light communication system which uses the photo-detector of the present invention. In FIG. 6, a light signal emitted from a light signal transmitter 23 is sent to a plurality of light signal receivers $24_1$, $24_2$, . . . which are connected in serial by an optical fiber 29. The light signal receivers have photo-detectors $25_1$, $25_2$, . . . constructed as shown in FIG. 1 and the light signal is detected by those photo-detectors. The photo-detector $25_1$ does not substantially absorb the light. Accordingly, the photo-detector $25_1$ transmits the light signal toward the photo-detector $25_2$ without attenuation. The photo detector $25_2$ also transmits the light signal toward the succeeding photo-detector without attenuation. Accordingly, in the light communication system which uses the photo-detector of the present invention, a plurality of receivers may be connected without providing light signal amplifiers in the transmission path or providing a light source for each receiver.

The signals detected by the photo-detectors $25_1$ and $25_2$ are demodulated by signal demodulators $26_1$ and $26_2$ and they are displayed on display devices $27_1$ and $27_2$ such as cathode ray tubes (CRT). The signal demodulators and the display devices are controlled by controllers $28_1$ and $28_2$.

The present invention may be applicable in various manners other than the embodiment described above. In the embodiment, the photo-detector is formed by the semiconductor layers of the quantum well structure (QWS), although it may be formed by a quantum line structure (QLS) in which the semiconductor layers are in the form or stripes having a fine width. The material of the wave guide layers is not limited to AlGaAs but various other materials such as InGaAsP, ZnS, ZnTe, CdS and CuCl may be used. The present invention covers all such modifications without departing from the scope of the claims.

We claim:

1. A method for detecting a light having a predetermined photon energy by a photo-detector including a semiconductor member having a source region, a gate region and a drain region, a first path for propagating an electron wave from the source region to the drain region through the gate region, and a second path for propagating an electron wave from the source region to the drain region through the gate region, the first path being of quantum well structure or quantum line structure and having a first electron energy level and a second electron energy level lighter than the first electron energy level, an energy difference between the first electron energy level and the second electron energy level being slightly less than the photon energy of the light to be detected, the second path being of quantum well structure or quantum line structure and having a third electron energy level and a fourth electron energy level higher than the third electron energy level, an energy difference between the third electron energy level and the fourth electron energy level being slightly larger than the photon energy of the light to be detected, a wave function of the electron wave propagating through the second path being coupled to a wave function of the electron wave propagating through the first path in the source region and the drain region and being separated from the wave function of the electron wave propagating through the first path in the gate region, said method comprising the steps of:

applying a voltage across the source region and the drain region to cause a current to flow thereacross;

applying the light to be detected to the first and second paths to shift the electron levels by an optical Stark effect; and detecting the current amount varied by a phase difference caused by the shift of the electron levels between the electron wave propagating through the first path and the electron wave propagating through the second path.

2. A method for detecting a light according to claim 1 wherein the photon energy of the light to be detected is larger than a longitudinal optical phonon energy.

3. A method for detecting a light according to claim 1 wherein the direction of an electric field vector of the light to be detected is normal to the direction of propagation of the electron wave.

4. A method for detecting a light according to claim 1 wherein the length of a portion of the second path to which the light to be detected is applied is longer than the non-elastic scattering length of electrons in the first and second paths.

5. A photo-detector for detecting a light having a predetermined photon energy, comprising:

a semiconductor member having a source region, a gate region and a drain region;

a first path for propagating an electron wave from the source region to the drain region through the gate region;

said first path being of quantum well structure or a quantum line structure and having a first electron level and a second electron level higher than the first electron level, an energy difference therebetween being slightly smaller than the photon energy of the light to be detected;

a second path for propagating an electron wave from the source region to the drain region through the gate region;

said second path being of quantum well structure or quantum line structure and having a third energy level and a fourth energy level higher than the third energy level, an energy difference therebetween being slightly larger than the photon energy of the light to be detected;

a wave function of the electron wave propagating through the second path being coupled with a wave function of the electron wave propagating through the first path in the source region and the drain region and separated from the wave function of the electron wave propagating through the first path in the gate region;

means for applying a voltage across the source region and the drain region;

means for detecting a current flowing across the source region and the drain region;

whereby when the light to be detected is applied to the second path, the electron levels are shifted by an optical Stark effect and a phase difference is created between the electron wave propagating through the first path and the electron wave propagating through the second path so that the current changes.

6. A photo-detector according to claim 5 wherein the photon energy of the light to be detected is larger than a longitudinal optical phonon energy.

7. A photo-detector according to claim 5 wherein the direction of an electric field vector of the light to be detected is normal to the direction of propagation of the electron wave.

8. A photo-detector according to claim 5 wherein the first path and the second path are integrally formed in the source region and the drain region.

9. A photo-detector according to claim 5 wherein the lengths of portions of the first path and the second path to which the light to be detected is applied are longer than the non-elastic scattering length of electrons in the first and second paths.

10. A photo-detector for detecting a light having a predetermined photon energy comprising:

a semiconductor member having a source region gate region and a drain region;

a first path for propagating an electron wave from the source region to the drain region through the gate region;

said first path being of quantum well structure or quantum line structure and having a first electron level and a second electron level higher than the first electron level, an energy difference therebetween being slightly smaller than the photon energy of the light to be detected;

a second path for propagating an electron wave from the source region to the drain region through the gate region;

said second path being of quantum well structure or quantum line structure and having a third energy level and a fourth energy level higher than the third energy level, an energy difference therebetween being slightly larger than the photon energy of the light to be detected;

a wave function of the electron wave propagating through the second path being coupled with a wave function of the electron wave propagating through the first path in the source region and the drain region and separated from the wave function of the electron wave propagating through the first path in the gate region;

means for applying a voltage across the source region and the drain region;

means for detecting a current flowing across the source region and the drain region;

wherein the following condition is met:

$$E_2 - E_1 < \hbar\omega < E_4 - E_3$$

$$\hbar\omega = E_2 - E_1 - \delta_1$$

$$\hbar\omega = E_4 - E_3 - \delta_2$$

$$\delta_1 < 0$$

$$\delta_2 > 0$$

$$|\delta_1| << \hbar\omega$$

$$|\delta_2| << \hbar\omega$$

Where $E_1$ a sub-band energy of the first electron level; $E_2$ is a sub-band energy of the second electron level, $E_3$ is a sub-band energy of the third energy level, $E_4$ is a sub-band energy of the fourth energy level and $\hbar\omega$ is the photon energy of the light to be detected;

whereby when the light to be detected is applied to the second the electron levels are shifted by an optical Stark effect and a phase difference is created between the electron wave propagating through the first path and the electron wave propagating through the second path so that the current changes.

11. A photo-detector according to claim 10 wherein the following condition is met:

$$|\delta_1| > \Gamma_1 + \Gamma_2$$

$$|\delta_2| > \Gamma_3 + \Gamma_4$$

$$\hbar\omega << \hbar\omega_{LO}$$

Where $\Gamma_1$ is an energy width of the first level, $\Gamma_2$ is an energy width of the second level, $\Gamma_3$ is an energy width of the third level, $\Gamma_4$ is an energy width of the fourth level and $\hbar\omega_{LO}$ is a longitudinal optical phonon energy.

12. A photo-detector according to claim 10 wherein the direction of an electric field vector of the light to be detected is normal to the direction of propagation of the electron wave.

13. A photo-detector according to claim 10 wherein the first path and the second path are integrally formed in the source region and the drain region.

14. A photo-detector according to claim 10 wherein the lengths of portions of the first path and the second path to which the light to be detected is applied are longer than the non-elastic scattering length of electrons in the first and second paths.

15. A semiconductor device having a source region, a gate region and a drain region, for use in a photo-detector for detecting a light having a predetermined photon energy, comprising:
- a substrate;
- a first waveguide layer formed on the substrate;
- said first waveguide layer propagating an electron wave from the source region to the drain region through the gate region;
- said first waveguide layer propagating an electron wave from the source region to the drain region through the gate region;
- said first waveguide layer being of quantum well structure or quantum line structure and having a plurality of electron levels having an energy difference therebetween slightly smaller than the photon energy of the light to be detected;
- a second waveguide layer formed on the substrate;
- said second waveguide layer propagating an electron wave from the source region to the drain region through the gate region;
- said second waveguide layer being of quantum well structure or quantum line structure and having a plurality of electron levels having an energy difference therebetween slightly larger than the photon energy of the light to be detected;
- a wave function of the electron wave propagating through the second waveguide layer being coupled to a wave function of the electron wave propagating through the first waveguide layer in the source region and the drain region and separated from the wave function of the electron wave propagating through the first waveguide layer in the gate region; and
- a pair of electrodes arranged in the source region and the drain region.

16. A semiconductor device according to claim 15 wherein the photon energy of the light to be detected is larger than a longitudinal optical phonon energy.

17. A semiconductor device according to claim 15 wherein the direction of an electric field vector of the light to be detected is normal to the plane of the second waveguide layer.

18. A semiconductor device according to claim 15 wherein the first waveguide layer and the second waveguide layer are integrally formed in the source region and the drain region.

19. A semiconductor device according to claim 15 further comprising first, second and third clad layers,
- said clad layers and said waveguide layers being laminated on the substrate in the sequence of the first clad layer, the first waveguide layer, the second clad layer, the second waveguide layer and the third clad layer.

20. A semiconductor device according to claim 19 wherein said third clad layer has a stripe-shaped raised portion extending along the direction of application of the light to be detected.

21. A semiconductor device according to claim 15 wherein elements of the electrodes are diffused into the first and second waveguide layers in the source region and the drain region to render the first and second waveguide layers to n-type.

22. A semiconductor device according to claim 15 wherein lengths of portions of the first and second waveguide layers to which the light to be detected is applied are shorter than the non-elastic scattering length of electrons in the first and second paths.

23. A semiconductor device having a source region, a gate region and a drain region, for use in a photo-detector for detecting a light having a predetermined photon energy, comprising:
- a substrate;
- a first waveguide layer formed on the substrate;
- said first waveguide layer propagating an electron wave from the source region to the drain region through the gate region;
- said first waveguide layer being of quantum well structure or quantum line structure and having a first electron level and a second electron level higher than the first electron level;
- a second waveguide layer formed on the substrate;
- said second waveguide layer propagating an electron wave from the source region to the drain region through the gate region;
- said second waveguide layer being of quantum well structure or quantum line structure and having a third electron level and a fourth electron level higher than the third electron level;
- a wave function of the electron wave propagating through the second waveguide layer being coupled to a wave function of the electron wave propagating through the first waveguide layer in the source region and the drain region and separated from the wave function of the electron wave propagating through the first waveguide layer in the gate region; and
- a pair of electrodes arranged in the source region and the drain region;
- wherein the following condition is met:

$$E_2 - E_1 < h\omega < E_4 - E_3$$

$$h\omega = E_2 - E_1 - \delta_1$$

$$h\omega = E_4 - E_3 - \delta_2$$

$$\delta_1 < 0$$

$$\delta_2 > 0$$

$$|\delta_1''| << h\omega$$

$$|\delta_2| << h\omega$$

Where $E_1$ is a sub-band energy of the first electron level; $E_2$ is a sub-band energy of the second electron level, $E_3$ is a sub-band energy of the third energy level $E_4$ is a sub-band energy of the fourth energy level and $h\omega$ is the photon energy of the light to be detected.

24. A semiconductor device according to claim 23 wherein the following condition is met:

$$|\delta_1| > \Gamma_1 + \Gamma_2$$

$$|\delta_2| > \Gamma_3 + \Gamma_4$$

$$h\omega << h\omega_{LO}$$

Where $\Gamma_1$ is an energy width of the first level, $\Gamma_2$ is an energy width of the second level, $\Gamma_3$ is an energy width of the third level, $\Gamma_4$ is an energy width of the fourth level and $h\omega_{LO}$ is a longitudinal optical phonon energy.

25. A semiconductor device according to claim 23 wherein the direction of an electric field vector of the light to be detected is normal to the planes of the first and second, waveguide layers.

26. A semiconductor device according to claim 23 wherein the first waveguide layer and the second waveguide layer are integrally formed in the source region and the drain region.

27. A semiconductor device according to claim 23 further comprising first, second and third clad layers,
said clad layers and said waveguide layers being laminated on the substrate in the sequence of the first clad layer, the first waveguide layer, the second clad layer, the second waveguide layer and the third clad layer.

28. A semiconductor device according to claim 27 wherein said third clad layer has a stripe-shaped raised portion extending along the direction of application of the light to be detected.

29. A semiconductor device according to claim 23 wherein elements of the electrodes are diffused into the first and second waveguide layers in the source region and the drain region to render the first and second waveguide layers to n-type.

30. A semiconductor device according to claim 23 wherein lengths of portions of the first and second waveguide layers to which the light to be detected is applied are shorter than the non-elastic scattering length of electrons in the first and second paths.

31. An optical communication system using a photo-detector, comprising:
an optical signal transmitter for emitting a light having a predetermined photon energy modulated according to a communication signal; and
an optical signal receiver for receiving the light emitted from the transmitter;
said receiver having a photo-detector for transmitting through a signal light detecting the signal light;
said photo-detector including:
a semiconductor member having a source region, a gate region and a drain region;
a first path for propagating an electron wave from the source region to the drain region through the gate region, said first path being of a quantum well structure or a quantum line structure having a plurality of an electron energy levels having an energy difference therebetween slightly smaller than the photon energy of the light to be detected;
a second path for propagating an electron wave from the source region to the drain region through the gate region;
said second path being of quantum well structure or a quantum line structure and having a plurality of electron levels having an energy difference therebetween slightly larger than the photon energy of the light to be detected;
a wave function of the electron wave propagating through the second path being coupled to a wave function of the electron wave propagating through the first path in the source region and the drain region and being separated from the wave function of the electron wave propagating through the first path in the gate region;
means for applying a voltage across the source region and the drain region; and
means for detecting a current flowing across the source region and the drain region;

wherein when the light to be detected is applied to the first and second paths, the electron levels are shifted by an optical Stark effect and a phase difference is created between the electron wave propagating through the first path and the electron wave propagating through the second path so that the current changes.

32. A light communication system according to claim 31 wherein the photon energy of the light to be detected is larger than a longitudinal optical phonon energy.

33. A light communication system according to claim 31 wherein the direction of an electric field vector of the light to be detected is normal to the direction of propagation of the electron wave.

34. A light communication system according to claim 31 wherein the first path and the second path are integrally formed in the source region and the drain region.

35. A communication method by use of an optical communication system including an optical signal transmitter and a photo-detector having:
a semiconductor member having a source region, a gate region and a drain region;
a first path for propagating an electron wave from the source region to the drain region through the gate region, said first path being of a quantum well structure or a quantum line structure and having a plurality of electron levels having an energy difference therebetween slightly smaller than the photon energy of the light to be detected; and
a second path for propagating an electron wave from the source region to the drain region through the gate region;
said second path being of quantum well structure or a quantum line structure and having a plurality of electron levels having an energy difference therebetween slightly larger than the photon energy of the light to be detected;
a wave function of the electron wave propagating through the second path being coupled to a wave function of the electron wave propagating through the first path in the source region and the drain region and being separated from the wave function of the electron wave propagating through the first path in the gate region;
said communication method comprising the steps of:
applying a voltage across the source region and the drain region of said photo-detector;
transmitting a light having a predetermined photon energy and modulated according to the communication signal by said transmitter;
applying the light to be detected, transmitted from the transmitter to said first and second paths to shift the electron levels by an optical Stark effect;
detecting a current flowing between the source region and the drain region and varied by a phase difference caused by the shift of the electron levels between the electron wave propagating through the first path and the electron wave propagating through the second path; and
demodulating the communication signal from the detected current.

* * * * *

UNITED STATES PATENT AND TRADEMARK OFFICE
CERTIFICATE OF CORRECTION

PATENT NO. : 5,285,068
DATED : February 8, 1994
INVENTOR(S) : AKIRA SHIMIZU, ET AL.

Page 1 of 3

It is certified that error appears in the above-identified patent and that said Letters Patent is hereby corrected as shown below:

COLUMN 2

Line 58, "portion" should read --portions--.
Line 60, "are" should read --is--.

COLUMN 4

Line 1, "intensity $\omega$" should read --intensity $\epsilon$--.

COLUMN 7

Line 2, "difference $\Theta$" should read --difference $\theta$--.
Line 7, "difference $\Theta$" should read --difference $\theta$--.
Line 17, "difference $\Theta$" should read --difference $\theta$--.

COLUMN 8

Line 3, "or" should read --of--.
Line 20, "lighter" should read --higher--.

COLUMN 9

Line 51, "region" should read --region,--.

COLUMN 10

Line 29, "$E_1$" should read --$E_1$ is--.
Line 35, "second" should read --second path,--.

UNITED STATES PATENT AND TRADEMARK OFFICE
CERTIFICATE OF CORRECTION

PATENT NO. : 5,285,068
DATED : February 8, 1994
INVENTOR(S) : AKIRA SHIMIZU, ET AL.

It is certified that error appears in the above-identified patent and that said Letters Patent is hereby corrected as shown below:

COLUMN 12

Line 32, "$E_2-E_1<h\omega<E_4-E_3$" should read --$E_2-E_1<\hbar\omega<E_4-E_3$--.
Line 34, "$h\omega=E_2-E_1-\delta_1$" should read --$\hbar\omega=E_2-E_1-\delta_1$--.
Line 35, "$h\omega=E_4-E_3-\delta_2$" should read --$\hbar\omega=E_4-E_3-\delta_2$--.
Line 41, "$|\delta_1|<<h\omega$" should read --$|\delta_1|<<\hbar\omega$--.
Line 43, "$|\delta_2|<<h\omega$" should read --$|\delta_2|<<\hbar\omega$--.
Line 46, "level" should read-- level, --.
Line 49, "$h\omega$" should read --$\hbar\omega$--.
Line 56, "$h\omega<<h\omega_{LO}$" should read --$\hbar\omega<<\hbar\omega_{LO}$--.
Line 61, "$h\omega_{LO}$" should read --$\hbar\omega_{LO}$--.
Line 65, "second," should read --second--.

COLUMN 13

Line 32, "light" (first occurrence) should read --light and--.
Line 40, "an" should be deleted. (first occurrence)

COLUMN 14

Line 8, "A light" should read --An optical--.
Line 11, "A light" should read --An optical--.

UNITED STATES PATENT AND TRADEMARK OFFICE
CERTIFICATE OF CORRECTION

PATENT NO. : 5,285,068
DATED : February 8, 1994
INVENTOR(S) : AKIRA SHIMIZU, ET AL.

It is certified that error appears in the above-identified patent and that said Letters Patent is hereby corrected as shown below:

COLUMN 14

Line 15, "A light" should read --An optical--.

Signed and Sealed this

Thirtieth Day of August, 1994

Attest:

BRUCE LEHMAN

Attesting Officer

Commissioner of Patents and Trademarks